United States Patent
Wada

(10) Patent No.: US 9,583,317 B2
(45) Date of Patent: Feb. 28, 2017

(54) PLASMA PROCESSING METHOD AND PLASMA PROCESSING APPARATUS

(71) Applicant: Tokyo Electron Limited, Tokyo (JP)

(72) Inventor: Toshiharu Wada, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/001,549

(22) Filed: Jan. 20, 2016

(65) Prior Publication Data
US 2016/0225585 A1   Aug. 4, 2016

(30) Foreign Application Priority Data
Feb. 3, 2015 (JP) .................. 2015-019660

(51) Int. Cl.
*H01J 37/32* (2006.01)

(52) U.S. Cl.
CPC .... *H01J 37/32449* (2013.01); *H01J 37/32834* (2013.01); *H01J 37/32862* (2013.01)

(58) Field of Classification Search
None
See application file for complete search history.

(56) References Cited

U.S. PATENT DOCUMENTS

| | | | | |
|---|---|---|---|---|
| 4,786,352 A * | 11/1988 | Benzing | ............... | B08B 7/0035 134/1 |
| 5,536,364 A * | 7/1996 | Yoshida | ............... | H01L 21/3081 257/E21.218 |
| 6,491,835 B1 * | 12/2002 | Kumar | ................ | H01L 21/3081 216/41 |
| 6,527,968 B1 * | 3/2003 | Wang | .................... | H01J 37/321 134/1.1 |
| 7,234,222 B1 * | 6/2007 | Hao | ..................... | H01J 37/3244 29/458 |
| 8,852,685 B2 * | 10/2014 | Kenworthy | ............ | B05D 7/222 427/235 |
| 2006/0166107 A1 * | 7/2006 | Chen | ........................ | C23F 4/00 430/5 |
| 2015/0017275 A1 * | 1/2015 | Mitamura | ............. | G03F 7/0002 425/385 |

FOREIGN PATENT DOCUMENTS

JP   2000-091327   3/2000

* cited by examiner

*Primary Examiner* — Allan Olsen
(74) *Attorney, Agent, or Firm* — IPUSA, PLLC

(57) ABSTRACT

A plasma processing method of performing a plasma process, using a plasma processing apparatus that includes a process chamber including a chromium (Cr) containing member and a mounting table placed in the process chamber, on a substrate on the mounting table, includes etching the substrate by plasma generated by a first gas containing bromine; after the etched substrate is carried out, forming a protection film by plasma generated by a second gas containing a $C_xF_y$ gas ($x \geq 1$, $y \geq 4$) and an inert gas; and evacuating a reaction product containing chromium generated in the etching.

5 Claims, 5 Drawing Sheets

| CONTAMINATION NUMBER [1 × E¹⁰ atoms/cm²] | | | |
|---|---|---|---|
| Na | Al | Cr | Fe |
| < 1.0 | < 15.0 | < 1.0 | < 1.0 |
| 0.01 | 14.4 | 9.9 | 0.87 |

FIG.5

| STEP | PROCESS CONDITION | CONTAMINATION NUMBER [1 × E$^{10}$ atoms/cm$^2$] |
|---|---|---|
| | | Cr |
| | | < 1.0 |
| ETCHING STEP | HIGH FREQUENCY POWER ON | 0.28 |
| | GAS ON | 0.05 |
| COATING STEP | HBr process | 0.23 |
| | CH$_4$/O$_2$ process | 0.41 |
| | C$_4$F$_8$/Ar process | 0.1 |

FIG.6

| STEP | PROCESS CONDITION | CONTAMINATION NUMBER [1 × E$^{10}$ atoms/cm$^2$] |
|---|---|---|
| | | Cr |
| | | < 1.0 |
| ETCHING STEP | HIGH FREQUENCY POWER ON | 21 |
| | GAS ON | 4.8 |
| COATING STEP | (1) HBr process(5min) | 16 |
| | (2) CH$_4$/O$_2$ process(5min) | 14 |
| | (3) C$_4$F$_8$/Ar process(1min) | 3.4 |
| | (4) C$_4$F$_8$/Ar process(5min) | 0.56 |

PLASMA PROCESSING METHOD AND PLASMA PROCESSING APPARATUS

CROSS-REFERENCE TO RELATED APPLICATION

The present application is based on and claims the benefit of priority of Japanese Priority Application No. 2015-019660 filed on Feb. 3, 2015, the entire contents of which are hereby incorporated by reference.

BACKGROUND OF THE INVENTION

1. Field of the Invention

The present invention relates to a plasma processing method and a plasma processing apparatus.

2. Description of the Related Art

With improvement in the degree of integration of semiconductor devices, heavy metal contamination in a process chamber is becoming an increasingly important problem in the processing of a silicon semiconductor wafer (hereinafter, referred to as a "wafer") and in the process of manufacturing a device. The heavy metal may be diffused and dissolved in a film on the wafer by a heat treatment to form a pair with a dopant that is generated when manufacturing a transistor or form a precipitate of the heavy metal, a stacking defect or the like. As a result, deterioration of withstand voltage of an oxide film or increasing of a leak current may occur.

Occurrence of the heavy metal contamination by chromium (Cr) depends on a performance or capability of a plasma processing apparatus. If a member containing Cr (hereinafter, referred to as a "Cr containing member" as well) is included in a plasma processing apparatus, a reaction product of Cr may be deposited on an inner wall of the process chamber when performing an etching process. The heavy metal contamination by Cr generated at this time causes a large influence on a performance of a semiconductor product and also lowers yield.

In order to reduce the heavy metal contamination by Cr, it can be considered to change a hardware structure of a plasma processing apparatus. However, there is a drawback in cost in order to improve the hardware structure of the apparatus, because the development cost increases. Thus, it is desired to reduce the contamination by Cr without changing the hardware structure of the apparatus.

For example, Patent Document 1 provides a technique in which, after performing plasma cleaning of an oxygen ($O_2$) gas under an etching condition where less deposition occurs and before starting etching, a film is deposited on an inner wall of a process chamber by plasma of a perfluorocyclobutane ($C_4F_8$) gas and an argon (Ar) gas. With this configuration, the inner wall of the process chamber is protected from the sputtering in the etching by the deposited film and beating out of the contamination from the inner wall to be adhered to the wafer can be prevented.

However, Patent Document 1 does not disclose what kind of substances the contamination includes, and does not disclose a method of preventing the heavy metal contamination in the process chamber when the reaction product generated by the plasma etching contains Cr.

PATENT DOCUMENT

[Patent Document 1] Japanese Laid-open Patent Publication No. 2000-91327

SUMMARY OF THE INVENTION

The present invention is made in light of the above problems, and provides a technique to prevent a heavy metal contamination of Cr in a process chamber in plasma etching.

According to an embodiment, there is provided a plasma processing method of performing a plasma process, using a plasma processing apparatus that includes a process chamber including a chromium (Cr) containing member and a mounting table placed in the process chamber, on a substrate on the mounting table, including etching the substrate by plasma generated by a first gas containing bromine; after the etched substrate is carried out, forming a protection film by plasma generated by a second gas containing a $C_xF_y$ gas ($x \geq 1$, $y \geq 4$) and an inert gas; and evacuating a reaction product containing chromium generated in the etching.

BRIEF DESCRIPTION OF THE DRAWINGS

Other objects, features and advantages of the present invention will become more apparent from the following detailed description when read in conjunction with the accompanying drawings.

FIG. 5 is a view illustrating an example of the contamination number when HBr or a corrosive gas is not used in an etching step;

FIG. 6 is a view illustrating an example of the contamination number when the plasma processing method of the embodiment is performed.

DETAILED DESCRIPTION OF THE PREFERRED EMBODIMENTS

Figure 1:
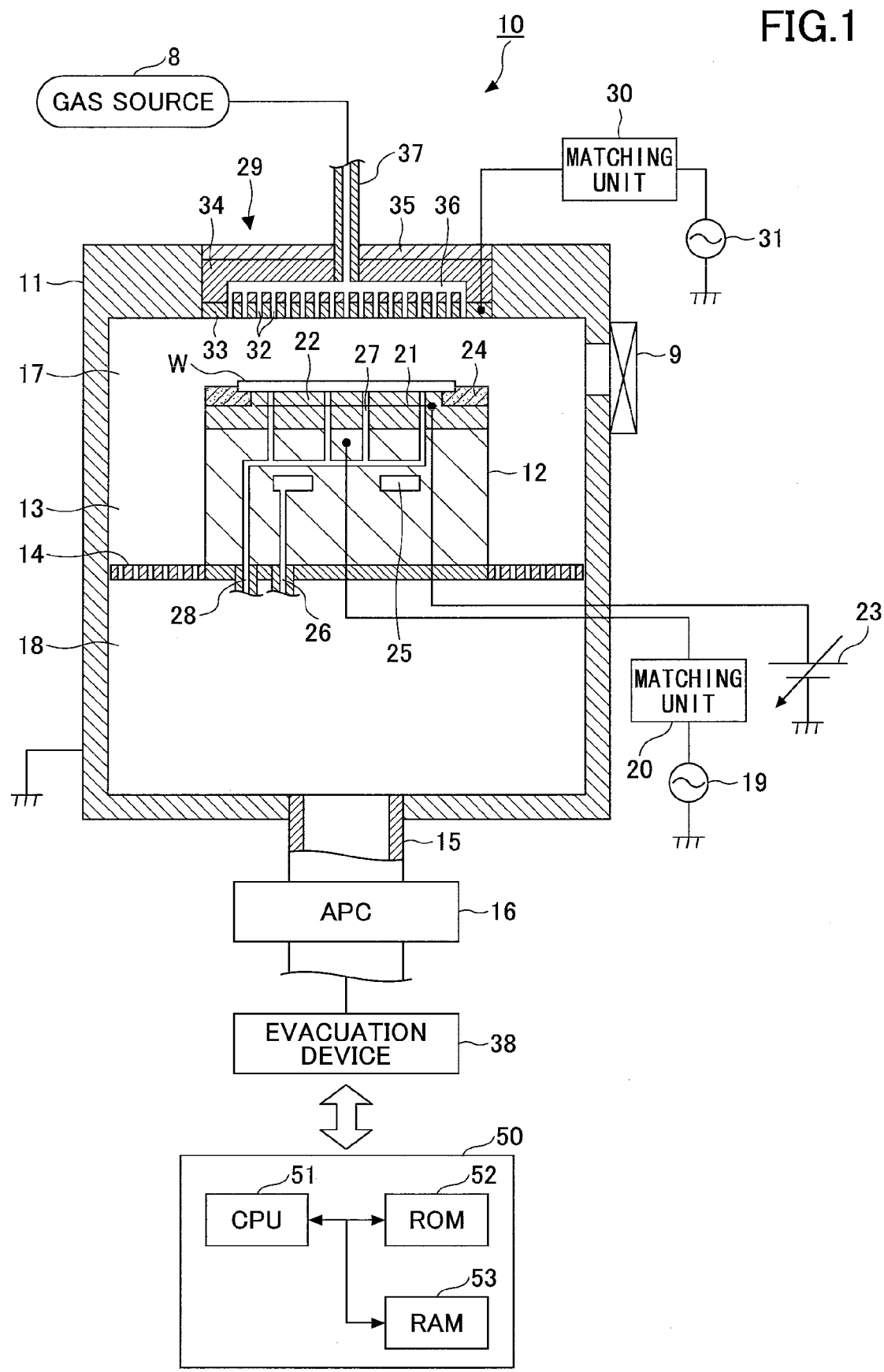
FIG. 1 is a vertical cross-sectional view illustrating an example of a plasma processing apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(Overall Structure of Plasma Processing Apparatus)

First, an overall structure of a plasma processing apparatus 10 of the embodiment is explained with reference to FIG. 1. The plasma processing apparatus 10 includes a gas source 8, a gate valve 9, a tubular process chamber 11, a mounting table 12, an evacuation path 13, an evacuation plate 14, an evacuation device 38, a first high frequency power source 19, a matching unit 20, an electrostatic chuck 22, a DC power 23, a circular focus ring 24, a circular coolant room 25, a gas shower head 29, a matching unit 30, a second high frequency power source 31 and a control unit 50.

The process chamber 11 is made of aluminum or the like and is capable of being sealed. The process chamber 11 is connected to ground potential. The mounting table 12 is made of a conductive material such as aluminum, for example, and is provided inside the process chamber 11. The mounting table 12 is a cylindrical table on which a wafer W is mounted and has a function as a lower electrode as well.

The evacuation path 13, which is a path to evacuate a gas above the mounting table 12 to outside of the process chamber 11, is formed between a side wall of the process chamber 11 and a side surface of the mounting table 12. The evacuation plate 14 is provided in the middle of the evacuation path 13. The evacuation plate 14 is a plate member provided with a plurality of holes, and functions as a partition plate that partitions an upper portion and a lower portion of the process chamber 11. The upper portion of the process chamber 11 partitioned by the evacuation plate 14 is a reaction room 17 in which a plasma process is performed. The evacuation device 38 is connected to an evacuation room (manifold) 18, which is the lower portion of the process chamber 11, via an evacuation pipe 15 that evacuates the gas in the process chamber 11 and an Adaptive Pressure Control (APC) valve 16. The evacuation plate 14 prevents leakage of plasma generated in the reaction room 17 to the evacuation room 18 by catching and reflecting the plasma. The evacuation device 38 depressurizes the process chamber 11 by adjusting the APC valve 16 to maintain the process chamber 11 at a desired vacuum state.

The first high frequency power source 19 is connected to the mounting table 12 via the matching unit 20, and provides high frequency electric power for bias (hereinafter, referred to as "LF" (Low Frequency) as well) of 400 kHz to 13.56 MHz, for example, to the mounting table 12. The matching unit 20 suppresses reflection of the high frequency electric power from the mounting table 12 to make the providing efficiency of the high frequency electric power for bias LF maximum.

The electrostatic chuck 22 includes its inside an electrostatic electrode plate 21 and is placed on the upper portion of the mounting table 12. The electrostatic chuck 22 has a structure in which an upper disk-shaped member is stacked on a lower disciform member, where the diameter of the upper disciform member is smaller than that of the lower disciform member. The electrostatic chuck 22 is made of aluminum and ceramic or the like is sprayed at an upper surface. When mounting the wafer W of the mounting table 12, the wafer W is placed on the upper disciform member of the electrostatic chuck 22.

The DC power 23 is connected to the electrostatic electrode plate 21. When a positive direct current (hereinafter, referred to as "HV" (High Voltage) as well) is applied to the electrostatic electrode plate 21, negative electric potential is generated at a back surface (a surface at an electrostatic chuck 22 side) of the wafer W and an electric potential difference is generated between the electrostatic electrode plate 21 and the back surface of the wafer W. The wafer W is electrostatically adsorbed on the upper disciform member of the electrostatic chuck 22 due to the Coulomb force or Johnson-Rahbek force generated by the electric potential difference and is retained.

Further, the focus ring 24 is mounted on the electrostatic chuck 22 such that to surround a circumference portion of the wafer W. The focus ring 24 is made of a conductive member, silicon, for example, convergences the plasma to a front surface of the wafer W in the reaction room 17 and improves efficiency of the etching process.

Further, the coolant room 25 extends in a circumference direction and is provided inside the mounting table 12. A low temperature coolant, cooling water or GALDEN (registered trademark), for example, is circularly provided to the coolant room 25 from a chiller unit via a pipe 26 for coolant. The mounting table 12 cooled by such low temperature coolant cools the wafer W and the focus ring 24 via the electrostatic chuck 22.

The electrostatic chuck 22 is provided with a plurality of heat-transfer gas providing holes 27 at a surface (adsorbing surface) on which the wafer W is adsorbed on the upper disciform member. A heat-transfer gas such as a helium (He) gas is provided to the plurality of heat-transfer gas providing holes 27 via a heat-transfer gas providing line 28. The heat-transfer gas is provided to a gap between the adsorbing surface of the electrostatic chuck 22 and the back surface of the wafer W via the heat-transfer gas providing holes 27 to transmit the heat of the wafer W to the electrostatic chuck 22.

The gas shower head 29 is placed at a ceiling portion of the process chamber 11 such that to face the mounting table 12. The second high frequency power source 31 is connected to the gas shower head 29 via the matching unit 30 and provides high frequency electric power (hereinafter, referred to as "HF" (High Frequency) as well) for plasma excitation of about 40 MHz, for example, to the gas shower head 29. As such, the gas shower head 29 functions as an upper electrode as well. Here, the matching unit 30 suppresses reflection of the high frequency electric power from the gas shower head 29 to make the providing efficiency of the high frequency electric power for plasma excitation HF maximum. The second high frequency power source 31 and the matching unit 30 may not be provided.

The gas shower head 29 includes a ceiling electrode plate 33 provided with a plurality of gas holes 32, a cooling plate 34 that detachably supports the ceiling electrode plate 33 and a cover body 35 that covers the cooling plate 34. Further, a buffer room 36 is provided in the cooling plate 34 and a gas introduction pipe 37 is connected to the buffer room 36. The gas shower head 29 provides the gas provided from the gas source 8 via the gas introduction pipe 37 and the buffer room 36 into the reaction room 17 via the plurality of the gas holes 32.

The gas shower head 29 is detachably attached to the process chamber 11 and functions as a cover of the process chamber 11. It is possible for an operator to directly touch the wall surface of the process chamber 11 or composing components when detaching the gas shower head 29 from the process chamber 11. With this configuration, the operator can clean the wall surface of the process chamber 11 or surfaces of the composing components and can remove adhered objects adhered on the wall surface of the process chamber 11 or the like.

In the plasma processing apparatus 10, plasma is generated from the gas provided from the gas shower head 29 and a plasma process such as etching or the like is performed on the wafer W by the plasma. Here, an operation of each of the composing components of the plasma processing apparatus 10 is controlled by the control unit 50 that controls the entirety of the plasma processing apparatus 10.

The control unit 50 includes a CPU 51, a ROM (Read Only Memory) 52 and a RAM (Random Access Memory) 53, and controls an etching process, a coating process and a cleaning process in accordance with steps set in a recipe stored in the RAM 53 or the like. Functions of the control unit 50 may be actualized by using software or hardware.

When performing a process such as etching in the plasma processing apparatus 10 structured as described above, first, the wafer W is carried in the process chamber 11 from the opened gate valve 9 under a condition being held on a transfer arm. After the wafer W is carried in, the gate valve 9 is closed. The wafer W is held by pusher pins above the electrostatic chuck 22, and is mounted on the electrostatic chuck 22 when the pusher pins move downward. The pressure in the process chamber 11 is reduced to a set value by the evacuation device 38. The gas is introduced into the process chamber 11 from the gas shower head 29 as a shower. The high frequency electric power of predetermined power is applied to the mounting table 12. Further, by applying voltage from the DC power 23 to the electrostatic electrode plate 21 of the electrostatic chuck 22, the wafer W can be electrostatically adsorbed on the electrostatic chuck 22.

Plasma is generated by ionizing and dissociating the introduced gas by the high frequency electric power. After plasma etching is performed on the wafer W by the plasma, the wafer W is held on the transfer arm and carried out from the process chamber 11. After plasma processes of coating, cleaning or the like are performed in the process chamber 11, a next wafer W is carried in the process chamber 11 and plasma etching is performed.

(Reaction Product of Chromium)

A member containing Cr (hereinafter, referred to as a "Cr containing member" as well) is included in the process chamber 11 of the plasma processing apparatus 10 of the embodiment. For example, there is a case that a gas providing pipe that provides a gas or other members may be made of metal containing Cr. When the Cr containing member is included in the process chamber 11, a reaction product of Cr may be deposited on an inner wall of the process chamber 11 when performing the etching process. The heavy metal contamination by Cr that is generated in this case influences the performance of the semiconductor product largely and lowers yield.

When providing a gas that contains either of bromine (Br), chlorine (Cl) and iodine (I) (hereinafter, referred to as a "first gas" as well) and etching the wafer W by plasma generated from the first gas, a reaction product containing Cr is generated and deposited on the inner wall of the process chamber 11. For example, when providing the first gas containing bromine, a reaction product containing chromium bromide (CrBr) is generated as an example of the reaction product containing Cr.

Figure 2:
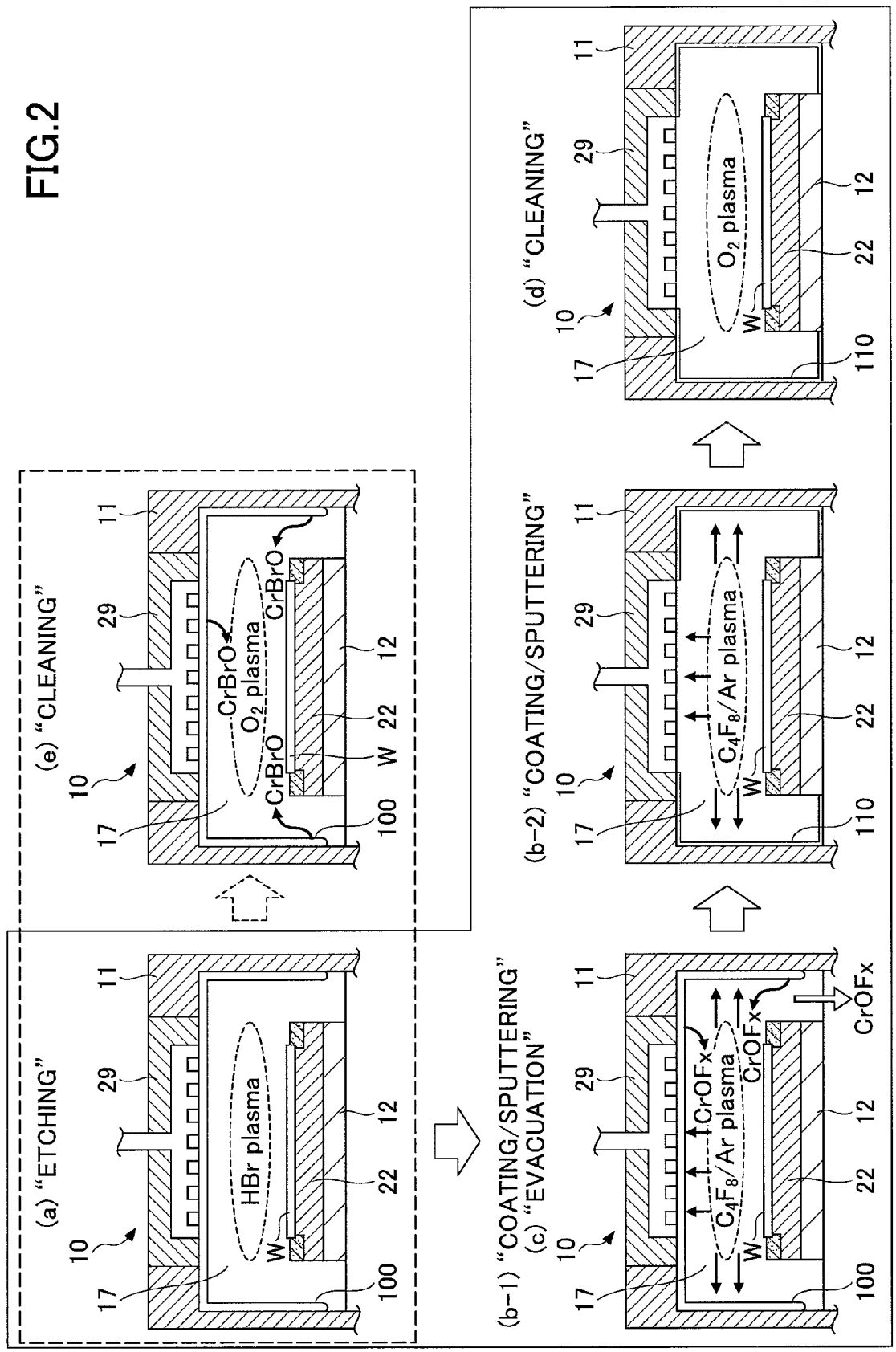
FIG. 2 is a view illustrating an example of plasma processing methods of the embodiment and a comparative example.

As illustrated in (a) "etching" of FIG. 2, for example, when the first gas includes a hydrogen bromide (HBr) gas, a chemical reaction expressed by the reaction formula (1) occurs during etching and a reaction product 100 containing CrBr is deposited on the inner wall of the process chamber 11.

$$Cr+HBr \rightarrow CrBr\downarrow \qquad (1)$$

After etching a previously determined number (one or a plurality) of wafers W, as illustrated in (e) "cleaning" of FIG. 2, the process chamber 11 is cleaned by $O_2$ plasma and the deposited reaction product is removed. Specifically, while cleaning, a chemical reaction expressed by the reaction formula (2) proceeds, and CrBr is vaporized by reacting with the $O_2$ plasma.

$$CrBr+O_2 \rightarrow CrBrO\uparrow \qquad (2)$$

Figures 3, 4:
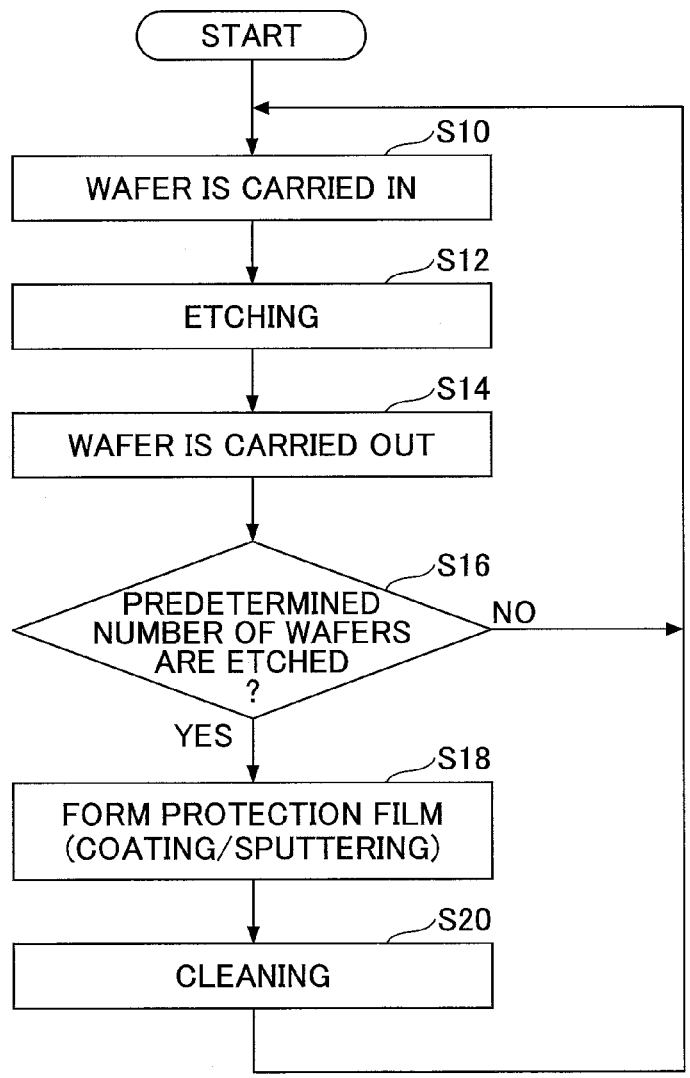
FIG. 3 is a view illustrating an example of a contamination number of the comparative example of the embodiment.
FIG. 4 is a flowchart illustrating an example of the plasma processing method of the embodiment.

As a result, vaporized CrBrO becomes a contamination, and heavy metal contamination of Cr in the process chamber 11 in the plasma etching occurs. FIG. 3 illustrates an example of a result of measuring the number of contaminations (hereinafter, referred to as the "contamination number") exist on the wafer W after performing the (a) "etching" and (e) "cleaning" of FIG. 2. When the contamination number is less than "$1.0 \times e^{10}$ (atoms/cm$^2$)" for each case of sodium (Na), chromium (Cr) and iron (Fe), it can be determined that metal contamination by each substance in the process chamber 11 does not occur. Further, for a case of aluminum (Al), when the number is less than "$15.0 \times e^{10}$ (atoms/cm$^2$)", it can be determined that metal contamination by aluminum in the process chamber 11 does not occur. From the result illustrated in FIG. 3, the contamination number of each of Na, Al and Fe is lower than the respective threshold value, and it can be determined that metal contamination of them does not occur. On the other hand, the contamination number of Cr is nine times higher than the threshold value, and it can be revealed that the contamination by Cr is a problem.

Thus, in the plasma processing method of the embodiment, it is possible to prevent the heavy metal contamination by Cr in the process chamber 11 when performing the plasma etching. The plasma processing method of the embodiment may be performed by the plasma processing apparatus 10 having the above described structure. However, the plasma processing method of the embodiment is not limited to a case using the above described plasma processing apparatus 10. For example, the plasma processing method of the embodiment may be performed by a Parallel Plate plasma processing apparatus in which the high frequency electric power for plasma excitation HF and the high frequency electric power for bias LF are applied to the mounting table 12, or by plasma processing apparatuses having other structures.

(Plasma Processing Method)

The plasma processing method of the embodiment is explained with reference to a flowchart of FIG. 4. According to the plasma processing method of the embodiment, a coating step of forming a protection film is performed between an etching step and a cleaning step. The etching step, the coating step and the cleaning step are controlled by the control unit 50.

First, an unprocessed wafer W is carried in the process chamber 11 (step S10). Next, a first gas containing either of bromine, chlorine and iodine is provided in the process chamber 11, and a step of etching the wafer W by plasma generated from the first gas is performed (step S12).

In this case, as described above, a reaction product containing Cr is generated during the step of etching, and is deposited on the inner wall of the process chamber 11. As illustrated in (a) "etching" of FIG. 2, when the first gas contains HBr gas, for example, the reaction product 100 containing CrBr is deposited on the inner wall of the process chamber 11 during etching by the chemical reaction expressed by the above described reaction formula (1).

Next, the wafer W for which the etching process is already done is carried out from the process chamber 11 (step S14). Next, whether a predetermined number of wafers W are etched is determined (step S16). The predetermined number is a previously set number and may be one, or two or more. The processes of steps S10 to S16 are repeated until the predetermined number of wafers W are etched. Then, when the predetermined number of wafers W are etched, the process proceeds to step S18.

In step S18, a coating step of forming a protection film on the inner wall or the like of the process chamber 11 is performed. At this time, a second gas containing a $C_xF_y$ gas ($x \geq 1$, $y \geq 4$) and an inert gas is provided in the process chamber 11, and a protection film is formed by plasma generated from the second gas.

Specifically, as illustrated in (b-1) and (b-2) of FIG. 2, sputtering and coating to the inner wall of the process chamber 11 are performed at the same time in the coating step. For example, when the second gas containing a perfluorocyclobutane ($C_4F_8$) gas and an argon (Ar) gas is provided, the reaction product 100 deposited on the inner wall of the process chamber 11 is sputtered by ions included in the plasma.

In the coating step, sputtering illustrated in (b-1) of FIG. 2 and coating illustrated in (b-2) of FIG. 2 are performed at the same time. First, effects of the sputtering illustrated in (b-1) of FIG. 2 are explained.

The reaction product 100 generated in the etching step (a) of FIG. 2 contains silicon (Si) of the ceiling electrode plate 33, silicon oxide ($SiO_2$) of the film to be etched and chromium bromide (CrBr). When the coating step is performed under this state, as illustrated in (b-1) of FIG. 2, CrOFx is beaten out from the reaction product 100 due to the sputtering function of the plasma generated from $C_4F_8$ and Ar gas. The chemical reaction formula (3) at this time is as follows.

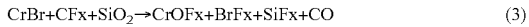

$$CrBr+CFx+SiO_2 \rightarrow CrOFx+BrFx+SiFx+CO \quad (3)$$

The vapor pressure of CrOFx at 20° C. is about 400 mmHg, and it is easily vaporized in the process chamber 11 that is maintained at a vacuum state. Thus, the CrOFx beaten out from the inner wall of the process chamber 11 is vaporized and is evacuated outside the process chamber 11 by the evacuation device 38 ((c) "evacuation" of FIG. 2 is performed during the coating step). The CrOFx is an example of a chromic fluoride containing object.

As such, under a state that CrOFx is evacuated, a protection film 110 containing fluoride (BrFx, SiFx) is formed on the inner wall of the process chamber 11 by the reaction formula (3), as illustrated in (b-2) of FIG. 2. As a result, the protection film 110 can be formed on the inner wall of the process chamber 11 while preventing the chromium contamination in the reaction room 17.

Referring back to FIG. 4, after forming the protection film 110, the cleaning step is performed in which a third gas containing an oxygen gas is provided in the process chamber 11 and the process chamber 11 cleaning is cleaned by plasma generated from the third gas (step S20).

As illustrated in (d) of FIG. 2, the inner wall of the process chamber 11 is protected by the protection film 110 when cleaning the process chamber 11 by oxygen plasma. With this configuration, even when a component of CrBr is left on the inner wall of the process chamber 11, phenomenon that CrBrO is generated by the reaction of CrBr and oxygen plasma can be prevented. With this, the heavy metal contamination of Cr in the process chamber 11 that occurs as CrBrO becomes a contamination can be prevented.

After cleaning, referring back to step S10, an unprocessed wafer W is carried in the process chamber 11, the etching process (steps S12 to S16), formation of the protection film (coating process: step S18) and the cleaning process (step S20) are performed in this order.

As explained above, according to the plasma processing method of the embodiment, a Cr containing object can be evacuated from the process chamber 11 by beating out the Cr containing object from the inner wall of the process chamber 11 by sputtering and vaporizing it during the step of forming the protection film 110. Further, by forming the protection film 110 on the inner wall of the process chamber 11, the Cr containing object adhered to the inner wall of the process chamber 11 can be coated by the protection film 110. With this configuration, the Cr containing object adhered on the inner wall of the process chamber 11 can be prevented from being vaporized by reacting with oxygen plasma in the cleaning step, and the heavy metal contamination by Cr in the process chamber 11 can be prevented.

(Experimental Results)

Results of the plasma processing method of the embodiment performed by the plasma processing apparatus 10 are explained with reference to FIG. 5 and FIG. 6. FIG. 5 illustrates an example of the contamination number on the wafer W when a HBr gas or a corrosive gas is not used in the etching step. In other words, FIG. 5 is a view illustrating results of measurement in which the contamination number of Cr on the wafer W was measured after the etching step in which the HBr gas or the corrosive gas is not used and formation of the protection film (coating step) is performed.

FIG. 6 is a view illustrating an example of the contamination number on the wafer W of the plasma processing method of the embodiment. In other words, FIG. 6 illustrates an example of results when the contamination number of Cr on the wafer W was measured after performing the etching step using the HBr gas and forming the protection film (coating step). As described above, it can be determined that the heavy metal contamination does not occur when the contamination number on the wafer W is less than $1.0 \times e^{10}$ (atoms/cm$^2$) for Cr.

In the etching step in which the HBr gas or the corrosive gas such as a fluorine-based gas was not used, as illustrated in FIG. 5, the contamination number of Cr on the wafer W was $0.28 \times e^{10}$ (atoms/cm$^2$) at the time when the high frequency electric power was on. Further, the contamination number of Cr on the wafer W was $0.05 \times e^{10}$ (atoms/cm$^2$) at the time when the etching gas that does not use the HBr gas or the corrosive gas such as the fluorine-based gas was on.

Next, when the HBr gas was used in the coating step that was performed after the etching step in which the HBr gas or the corrosive gas was not used, the contamination number by Cr on the wafer W after the coating step was performed was $0.23 \times e^{10}$ (atoms/cm$^2$).

When $CH_4$ and the $O_2$ gas were used in the coating step that was performed after the etching step in which the HBr gas or the corrosive gas was not used, the contamination number by Cr on the wafer W after the coating step was performed was $0.41 \times e^{10}$ (atoms/cm$^2$).

When $C_4F_8$ and the Ar gas were used in the coating step that was performed after the etching step in which the HBr gas or the corrosive gas was not used, the contamination number by Cr on the wafer W after the coating step was performed was $0.1 \times e^{10}$ (atoms/cm$^2$).

With this, it was revealed that when the HBr gas or the corrosive gas is not used in the etching step, the contamination number of Cr is less than $1.0 \times e^{10}$ (atoms/cm$^2$) and the heavy metal contamination of Cr in the process chamber 11 does not occur.

On the other hand, in the etching step in which the HBr gas or the corrosive gas such as the fluorine-based gas is used, it is necessary to prevent the heavy metal contamination of Cr in the process chamber 11. As illustrated in FIG. 6, in the etching step in which the HBr gas was used, the contamination number of Cr on the wafer W was $21 \times e^{10}$ (atoms/cm$^2$) at the time when the high frequency electric power was on. Further, the contamination number of Cr on the wafer W was $4.8 \times e^{10}$ (atoms/cm$^2$) at the time when the etching gas (first gas) containing the HBr gas was on.

Next, FIG. 6 illustrates results of forming four kinds of protection films (1) to (4) as follows in the coating step.

(1) formation of a protection film by the HBr gas (deposition time: 5 minutes)
(2) formation of a protection film by $CH_4$ and the $O_2$ gas (deposition time: 5 minutes)
(3) formation of a protection film by $C_4F_8$ and the Ar gas (deposition time: 1 minute)
(4) formation of a protection film by $C_4F_8$ and the Ar gas (deposition time: 5 minutes)

As a result, for any of the cases of (1) to (3), the contamination number of Cr was larger than $1.0 \times e^{10}$ (atoms/$cm^2$). This means that for the protection films of (1) to (3), the heavy metal contamination of Cr occurred in the process chamber 11.

On the other hand, for the case of (4), the contamination number of Cr was $0.56 \times e^{10}$ (atoms/$cm^2$), which was less than $1.0 \times e^{10}$ (atoms/$cm^2$). Thus, it can be determined that the heavy metal contamination of Cr in the process chamber 11 did not occur. This means that it was revealed that the contamination number of Cr was reduced to an extent where it could be determined that the heavy metal contamination of Cr in the process chamber 11 did not occur by performing the coating step of (4) formation of a protection film by $C_4F_8$ and the Ar gas for 5 minutes.

As a result of the experiment, by performing sputtering and deposition at the same time in the coating step using $C_4F_8$ and the Ar gas that was performed after the etching step using the HBr gas, the contamination number of Cr was reduced to $5.6 \times e^9$ (atoms/$cm^2$) from $2.1 \times e^{11}$ (atoms/$cm^2$), and it was revealed that the heavy metal contamination of Cr in the process chamber 11 could be prevented. However, when the deposition time was 1 minute, the thickness of the protection film 110 was not sufficient and the heavy metal contamination of Cr could not be sufficiently reduced. On the other hand, when the deposition time was 5 minutes, the thickness of the protection film 110 was sufficient and the heavy metal contamination of Cr could be prevented.

Further, as a result of the experiment, by the coating step using $CH_4$ and the $O_2$ gas that was performed after the etching step using the HBr gas, the contamination number of Cr could not be sufficiently reduced to prevent the heavy metal contamination of Cr in the process chamber 11. However, although it is not illustrated in FIG. 6, the contamination number of Y could be reduced to $2.4 \times e^{10}$ atoms/$cm^2$ from $2.0 \times e^{11}$ (atoms/$cm^2$) in this case, and it was revealed that the metal contamination of Y in the process chamber 11 could be prevented.

Figure 7:
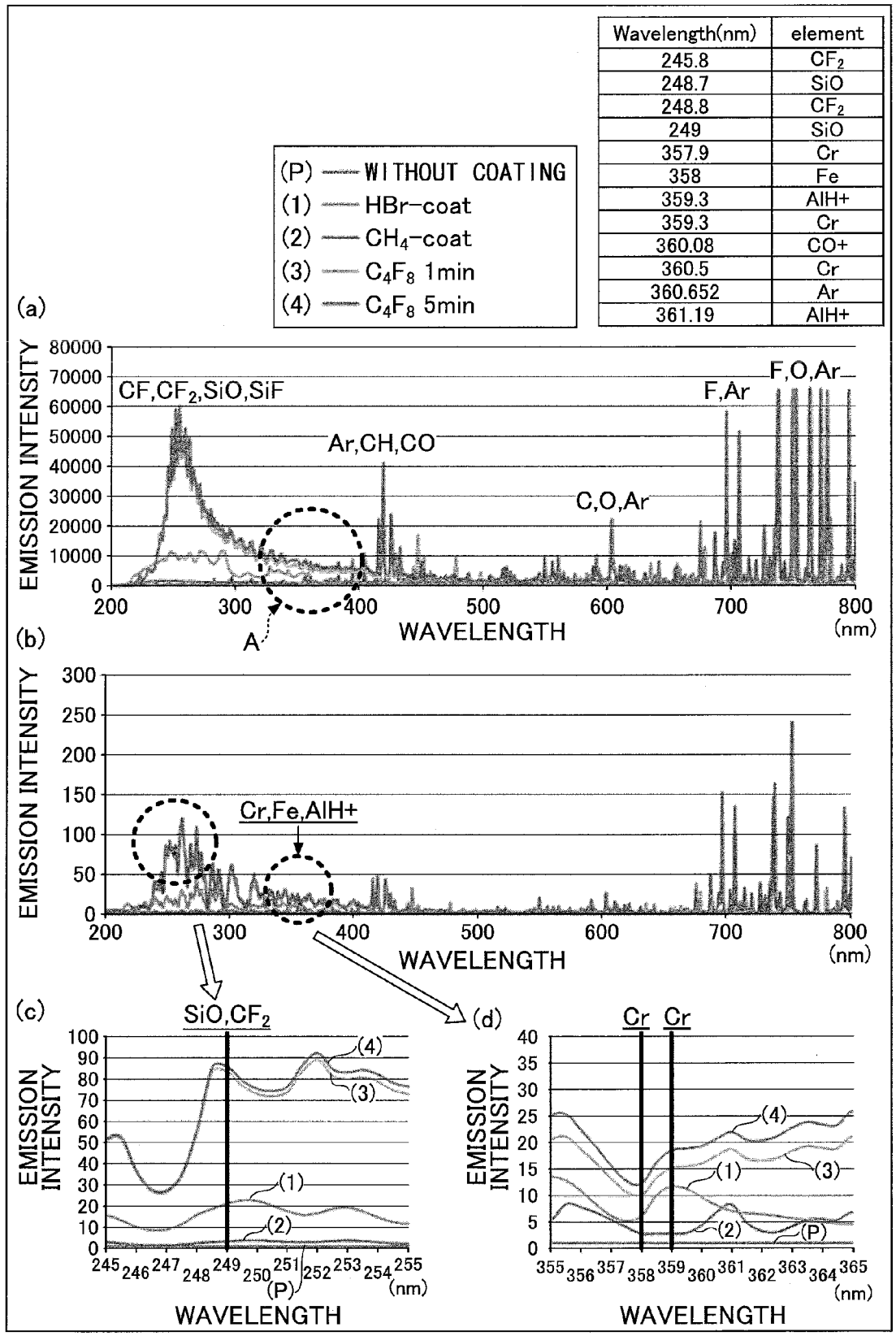
FIG. 7 is a view illustrating an example of formation of the protection film and a result of EPD data analysis of the embodiment.

Further, FIG. 7 illustrates results of EPD (End point Detection) data analysis of inside the process chamber 11 for each of the cases when the protection films (1) to (4) of FIG. 6 were formed, and a case in which the protection film was not formed (without coating: (P)). In FIG. 7, (a) illustrates emission intensities of all substances (all wavelengths) in the process chamber 11.

According to the EPD data analysis result illustrated in (a) of FIG. 7, peaks of the wavelength exist around 250 nm, and it can be revealed that components of CF, $CF_2$, SiO and SiF exist in the protection film. With reference to (b) of FIG. 7 in which the wavelength range expressed by a circle "A" in (a) of FIG. 7 is illustrated by changing the scale of the emission intensity and a composition table of wavelengths to compositions, respectively, illustrated at an upper-right portion of FIG. 7, it can be revealed that components of Cr, Fe and AlH+ exist in the protection film at the wavelength range expressed by the circle "A".

Further, a component whose wavelength range is around 250 nm is explained with reference to (c) of FIG. 7, and a component whose wavelength range is around 350 nm is explained with reference to (d) of FIG. 7. As illustrated in (c) of FIG. 7, it can be revealed that the emission intensity of SiO and $CF_2$ components of the protection film expressed by the wavelength of 249 nm is high for (4) and (3) and lower for (2), (1) and without coating (P).

Further, as illustrated in (d) of FIG. 7, it can be revealed that the emission intensity of the Cr component of the protection film expressed by the wavelength of 358 nm and 359 nm is the highest for (4) and becomes lower for (3), (1), (2) and without coating (P) in this order. Thus, from these results, it can be revealed that for (4) and (3) in which the protection film was formed by $C_4F_8$ and the Ar gas, the evacuation of the Cr component was promoted, the Cr component was prevented from being beaten out from the inner wall due to the protection film, and the Cr contamination was least generated in the process chamber 11.

From the above results, according to the plasma processing method of the embodiment, it was revealed that the heavy metal contamination by Cr was prevented by performing the step of forming the protection film (coating step) by the gas containing the $C_4F_8$ gas between the etching step and the cleaning step.

Here, in the step of forming the protection film 110, the $C_xF_y$ gas contained in the second gas that is provided to the process chamber 11 is not limited to the $C_4F_8$ gas as long as it is a fluorocarbon gas that satisfies $x \geq 1$ and $y \geq 4$. For example, the $C_xF_y$ gas may be at least one of $CF_4$, $C_3F_6$, $C_4F_6$, $C_4F_8$ and $C_5F_8$. Further, the inert gas contained in the second gas is not limited to the argon gas, and may be an inert gas such as a helium (He) gas, for example.

As described above, according to the plasma processing method and the plasma processing apparatus 10 of the embodiment, the heavy metal contamination by Cr in the process chamber 11 can be prevented without improving the hardware structure of the apparatus.

A technique to prevent a heavy metal contamination of Cr in a process chamber in plasma etching is provided.

Although a preferred embodiment of the plasma processing method and the plasma processing apparatus has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, the plasma processing method of the embodiment is applicable not only to the Parallel Plate Capacitively Coupled Plasma (CCP) apparatus as explained above in the embodiment, but also to other plasma processing apparatuses. As the other plasma processing apparatuses, an Inductively Coupled Plasma (ICP) apparatus, a plasma processing apparatus using a radial line slot antenna, a Helicon Wave Plasma (HWP) apparatus, an Electron Cyclotron Resonance Plasma (ECR) apparatus or the like may be raised. Here, a process chamber of such a plasma processing apparatus includes a Cr containing member, and heavy metal contamination of Cr can be prevented by the plasma processing method of the embodiment.

Further, the substrate processed by the plasma processing method of the embodiment is not limited to a wafer, and may be a large-size substrate for a Flat Panel Display, or a substrate for an EL element or for a photovoltaic cell, for example.

What is claimed is:

1. A plasma processing method of performing a plasma process, using a plasma processing apparatus that includes a process chamber including a chromium (Cr) containing member and a mounting table placed in the process chamber, on a substrate on the mounting table, comprising:
    etching the substrate by plasma generated by a first gas containing bromine;
    after the etched substrate is carried out, forming a protection film by plasma generated by a second gas containing a $C_xF_y$ gas ($x \geq 1$, $y \geq 4$) and an inert gas; and
    evacuating a reaction product containing chromium generated in the etching.

2. The plasma processing method according to claim 1, further comprising:
    after the forming the protection film, cleaning the process chamber by plasma generated from a third gas containing oxygen.

3. The plasma processing method according to claim 1, wherein the first gas contains a hydrogen bromide (HBr) gas.

4. The plasma processing method according to claim 1, wherein in the forming the protection film, a chromic fluoride containing object is generated from a reaction product containing chromium bromide, and
    wherein in the evacuating, the chromic fluoride containing object is evacuated.

5. The plasma processing method according to claim 1, wherein the $C_xF_y$ gas is at least either of $CF_4$, $C_3F_6$, $C_4F_6$, $C_4F_8$ and $C_5F_8$.

* * * * *